(12) United States Patent
Boo et al.

(10) Patent No.: US 6,840,846 B2
(45) Date of Patent: Jan. 11, 2005

(54) POLISHING STATION OF A CHEMICAL MECHANICAL POLISHING APPARATUS

(75) Inventors: Jae-Phil Boo, Seongnam-si (KR); Jun-Gyu Ryu, Seoul (KR); Hyun-Sung Lee, Suwon-si (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/456,903

(22) Filed: Jun. 9, 2003

(65) Prior Publication Data

US 2003/0236056 A1 Dec. 25, 2003

(30) Foreign Application Priority Data

Jun. 21, 2002 (KR) .................................. 10-2002-0034860

(51) Int. Cl.[7] .................................................. B24B 1/00
(52) U.S. Cl. ........................ 451/285; 451/41; 451/56; 451/60; 451/286; 451/287; 451/288; 451/289; 451/443; 451/444; 451/446
(58) Field of Search .............................. 451/41, 56, 60, 451/286, 287, 288, 289, 443, 444, 446

(56) References Cited

U.S. PATENT DOCUMENTS 6,126,517 A * 10/2000 Tolles et al. .................... 451/41

6,537,143 B1 * 3/2003 Yang et al. ................... 451/388

FOREIGN PATENT DOCUMENTS

JP 8-229807 9/1996

* cited by examiner

*Primary Examiner*—Lee D. Wilson
*Assistant Examiner*—Shantese McDonald
(74) *Attorney, Agent, or Firm*—Lee & Sterba, P.C.

(57) ABSTRACT

An apparatus for polishing a wafer includes a polishing station having a platen on which a polishing pad is installed, a polishing head having a membrane that contacts a surface of the wafer, the membrane securing the wafer and pressuring the wafer against the polishing pad, wherein the polishing station includes a transfer stage for loading the wafer on or unloading the wafer from the polishing head, and wherein the transfer stage includes a pedestal on which the wafer is placed and a fluid supply part for supplying a fluid into a boundary region between the wafer and the membrane to reduce a surface tension between the wafer and the membrane. Preferably, the apparatus further includes a stopper for preventing the wafer placed on the pedestal from being lifted up along with the membrane when the wafer is unloaded from the polishing head onto the pedestal.

11 Claims, 9 Drawing Sheets

POLISHING STATION OF A CHEMICAL MECHANICAL POLISHING APPARATUS

BACKGROUND OF THE INVENTION

1. Field of the Invention

The present invention relates to an apparatus for manufacturing semiconductor wafers. More particularly, the present invention relates to an apparatus for chemically and mechanically planarizing a surface of a semiconductor wafer.

2. Description of the Related Art

As semiconductor devices have continued to be scaled down, an interconnection structure thereof trends toward a multi-layer structure. Such a multi-layer structure results in an increase in a surface step difference between unit cells stacked on a semiconductor substrate. To reduce this step difference, various methods for planarizing the surface of a wafer have been proposed. One proposed technique is chemical mechanical polishing (CMP).

In a CMP apparatus, a wafer is typically positioned on a polishing head so that a wafer surface to be polished (i.e., the process surface or polishing surface) faces a polishing pad. Then, the surface of the wafer to be polished is placed on the polishing pad installed on a platen. The polishing head provides a controllable pressing force onto a rear side of wafer to press the wafer against the polishing pad. Simultaneously, the polishing head may be rotated to provide additional movement between the wafer and the polishing pad.

Many manufacturers of CMP apparatus are developing various types of polishing heads having membranes. A polishing head having a membrane chucks a wafer using vacuum pressure and then releases the wafer using forced air.

FIGS. 1A, 1B, and 1C illustrate views of a conventional wafer unloading process. In FIGS. 1A, 1B and 1C, reference numerals 10, 12, 20, and 22 designate a polishing head, a membrane, a transfer stage, and a pedestal, respectively. Reference character W designates a wafer.

Referring first to FIG. 1A, when the polishing head 10 moves to the transfer stage 20, the pedestal 22 of the transfer stage 20 ascends. Then, as shown in FIG. 1B, the membrane 12 is expanded by an air pressure and the wafer W is placed on the pedestal 22. Next, as shown in FIG. 1C, the membrane 12 is contracted after the wafer W has been placed on the pedestal 22.

If the membrane 12 is contracted before the wafer W is completely separated from the membrane 12, for example, when edge portions of the wafer W are separated from the membrane 12 but a center portion of the wafer W still remains in contact with the membrane 12, the wafer W will be lifted up by hanging onto the membrane 12. This lifting will result in a wafer unloading error. Particularly, in a case that a wafer W has a hydrophobic surface, such a wafer unloading error will frequently occur due to the surface tension of a contact surface between the wafer W and the membrane 12.

SUMMARY OF THE INVENTION

It is a feature of an embodiment of the present invention to provide an apparatus for polishing a wafer that is able to stably unload a wafer from a transfer stage.

According to an aspect of the present invention, an apparatus for polishing a wafer includes a polishing station having a platen on which a polishing pad is installed; a polishing head having a membrane that contacts a surface of the wafer, the membrane securing the wafer and pressuring the wafer against the polishing pad, wherein the polishing station includes a transfer stage for loading the wafer on or unloading the wafer from the polishing head, and wherein the transfer stage includes a pedestal on which the wafer is placed and a fluid supply part for supplying a fluid into a boundary region between the wafer and the membrane to reduce a surface tension between the wafer and the membrane. The polishing pad is preferably a composite material having a rough polished face.

In an embodiment of the present invention, the fluid supply part may include a spray nozzle for spraying pure water into the boundary region between the wafer and the membrane. Alternately, the fluid supply part may include a spray nozzle for spraying an inert gas into the boundary region between the wafer and the membrane.

In an embodiment of the present invention, the pedestal includes a plurality of vacuum holes to adsorb the wafer using vacuum pressure when the wafer is unloaded from the polishing head onto the pedestal.

In an embodiment of the present invention, the transfer stage further includes a stopper for preventing the wafer placed on the pedestal from being lifted up along with the membrane when the wafer is unloaded from the polishing head onto the pedestal. Preferably, the stopper includes a blade inserted into the boundary region between the wafer and the membrane to prevent the wafer from being lifted up along with the membrane; and a driving part for driving the blade to either move into or out of the boundary region between the wafer and the membrane. In this embodiment, it is preferable that the stopper have a length at least minimally sufficient to extend into the boundary region between the wafer and the membrane and minimize a friction area when contacted with the wafer.

In an embodiment of the present invention, the pedestal includes an elevating part for moving the pedestal vertically.

In another embodiment of the present invention, the transfer stage may further include a catch cup surrounding the pedestal.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF THE INVENTION

Korean Patent Application No. 2002-34860, filed on Jun. 21, 2003, and entitled: "Polishing Station of a Chemical Mechanical Polishing Apparatus," is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 1A:
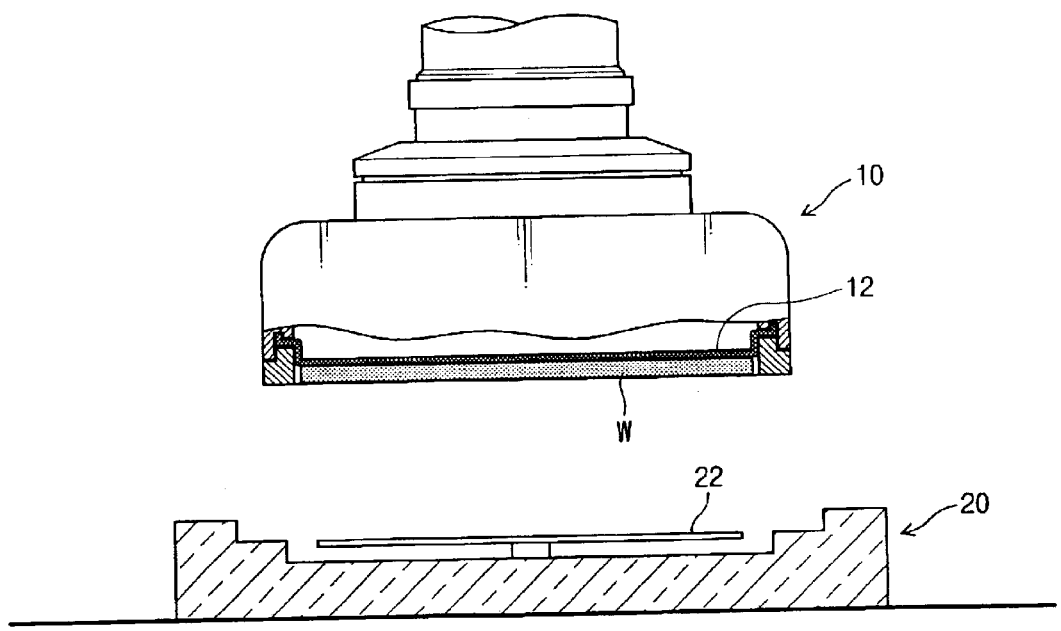
FIGS. 1A, 1B, and 1C illustrate views of a conventional wafer unloading process.
Figure 1B:
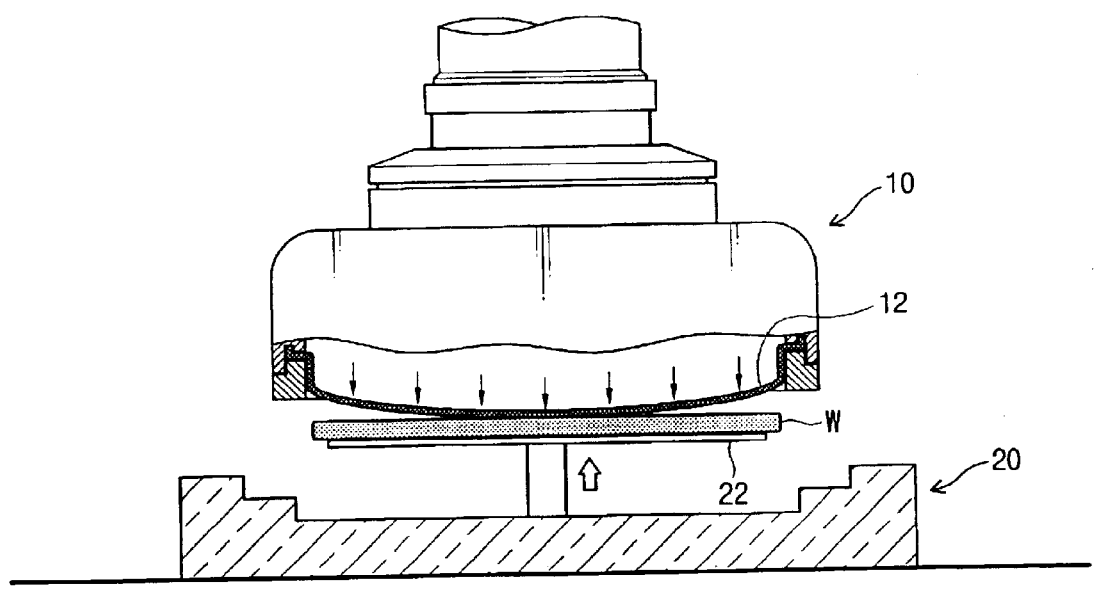
Figure 1C:
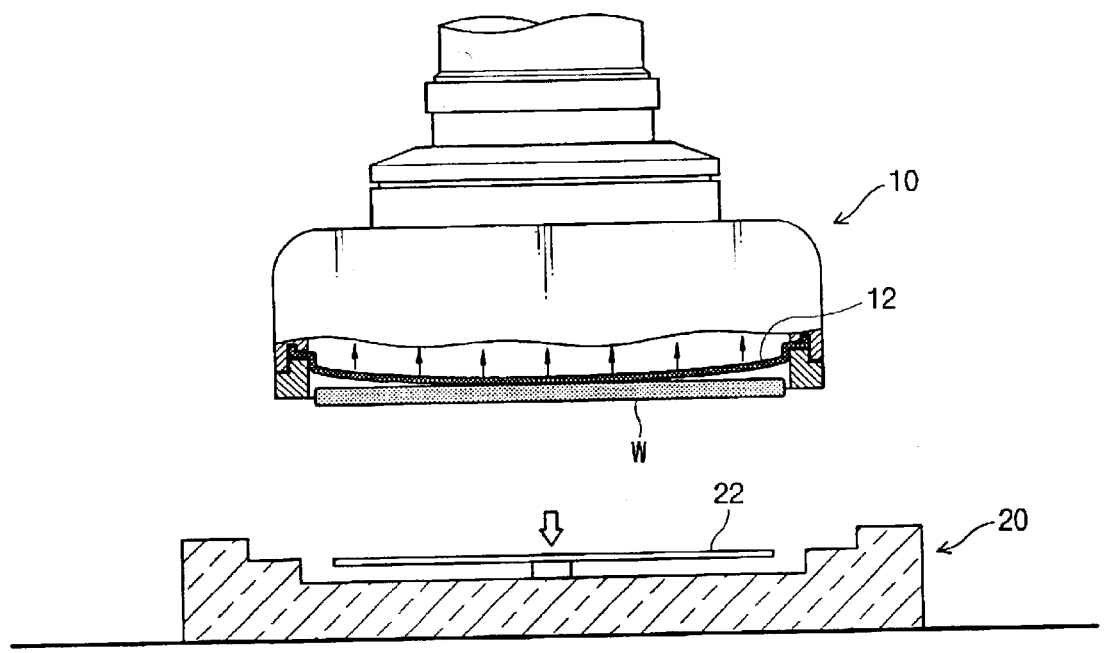
Figure 2:
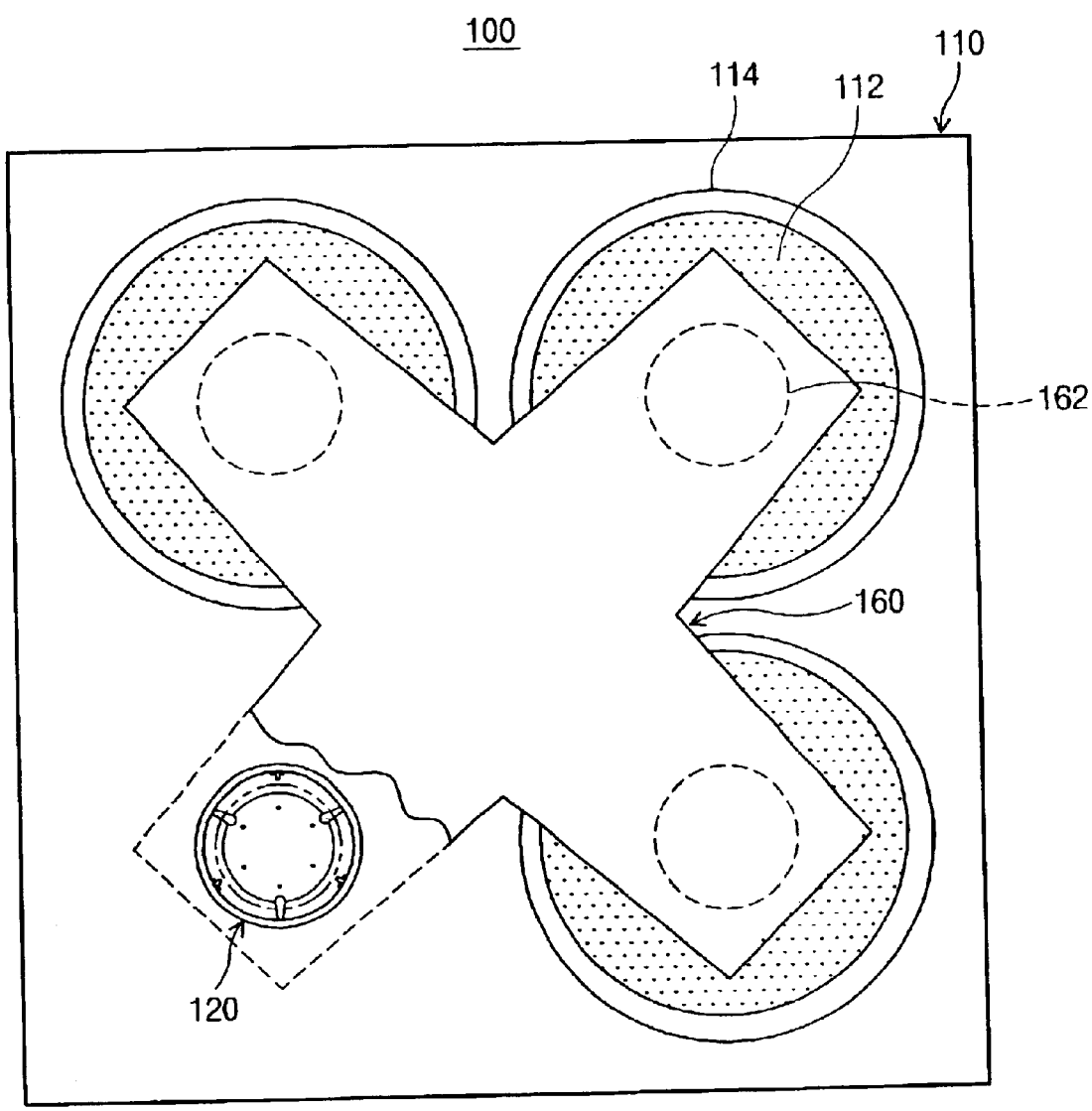
FIG. 2 illustrates a plane view of a CMP apparatus according to a preferred embodiment of the present invention.

Referring to FIG. 2, a CMP apparatus 100 according to an embodiment of the present invention includes a polishing station 110 and a polishing head assembly 160. The polishing station 110 includes a rotatable platen 114, to which a polishing pad 112 adheres, and a wafer transfer stage 120.

The platen 114 is rotated by a rotating means (not shown) at an appropriate speed. The polishing pad 112 may be a composite material having a rough polished face.

The polishing station 110 has a pad conditioning means (not shown) and a slurry supply means (not shown) for supplying a slurry onto a surface of the polishing pad 112. The slurry preferably contains a reaction reagent (e.g., de-ionized water for oxide polishing), friction particles (e.g., silicon dioxide for oxide polishing), and a chemical reaction catalyst (e.g., potassium hydroxide for oxide polishing).

The polishing head assembly 160 preferably includes four polishing heads 162. In FIG. 2, illustration of one of the polishing heads 162 is omitted to allow an illustration of elements of the transfer stage 120, which is disposed below the polishing head 162. The polishing head assembly 160 is able to rotate about a central axis thereof so that one of the polishing heads 162 may be located in the platen 114 or the transfer stage 120. A polishing head 162 secures a wafer W against a polishing pad 112 and uniformly distributes a downward pressure to a rear side of the wafer W.

Figure 3:
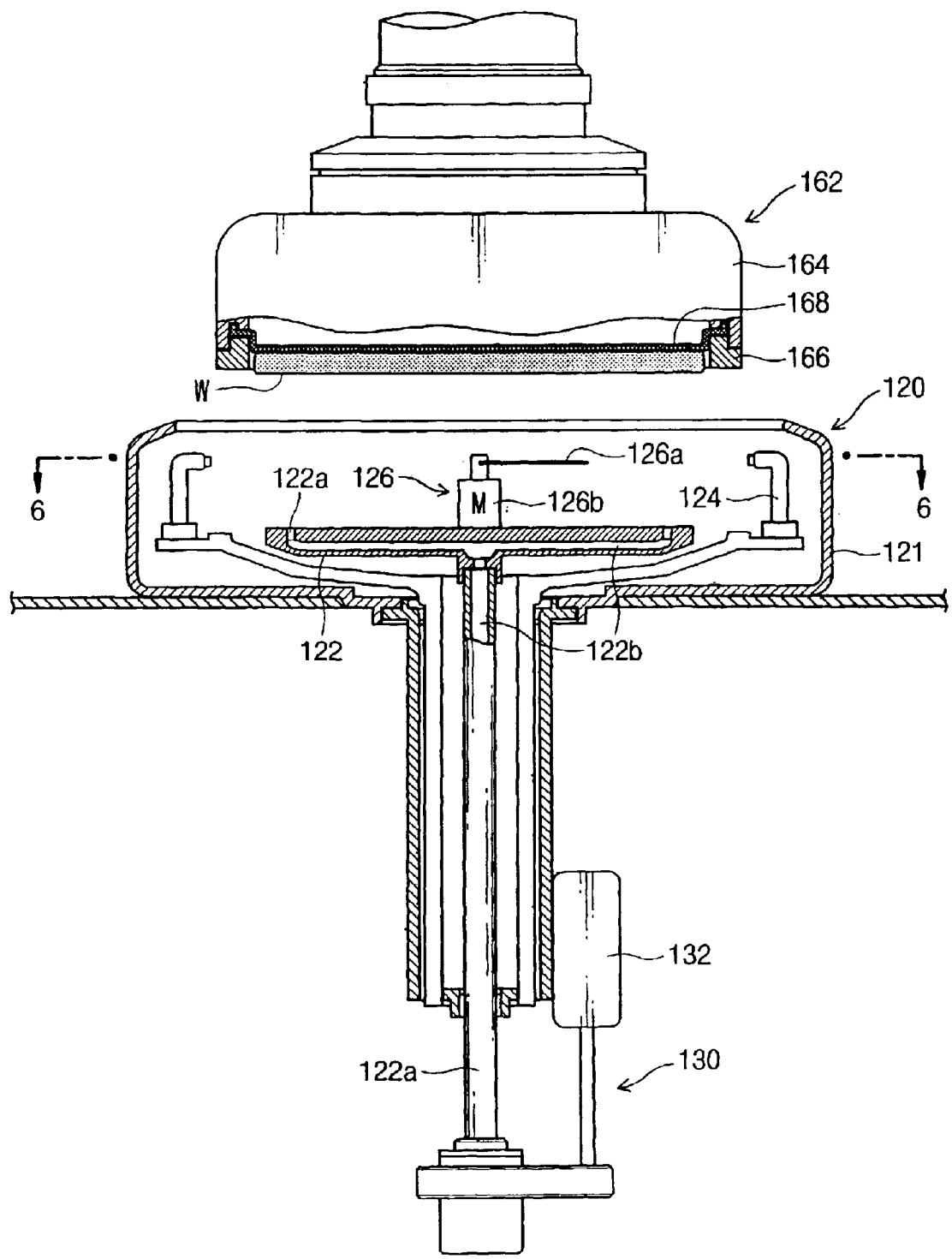
FIG. 3 illustrates a fragmentary side sectional view of a polishing head and a transfer stage of FIG. 2.

Referring to FIG. 3, a polishing head 162 includes a carrier 164, a retainer ring 166, and a membrane 168 of flexible material. The membrane 168 is a thin rubber film that directly contacts a surface of the wafer and uniformly pressures the wafer W when expanded by air pressure.

The polishing head 162 chucks or releases the wafer W by applying a vacuum pressure to the wafer or by forcing air between the wafer W and the membrane 168. The wafer W is loaded on or unloaded from the polishing head 162 through the transfer stage 120.

The transfer stage 120 includes a pedestal 122, a fluid supply part, which is preferably a pure water spray nozzle 124, a stopper 126, and a catch cup 121. The stopper 126 will be described in greater detail in connection with FIG. 6.

The pedestal 122, the pure water spray nozzle 124 and the stopper 126 are located on an inside of the catch cup 121. An elevating part 130 connected to an axis 122a of the pedestal 122 raises the pedestal. The elevating part 130 preferably includes a general hydraulic cylinder 132. A plurality of vacuum holes 122a are formed on an edge of the pedestal 122 to secure the wafer W. The vacuum holes 122a are connected with a vacuum pathway 122b formed on an inside of the pedestal 122 and the vacuum pathway 122b is connected to an outside vacuum pump (not shown).

Figure 4:
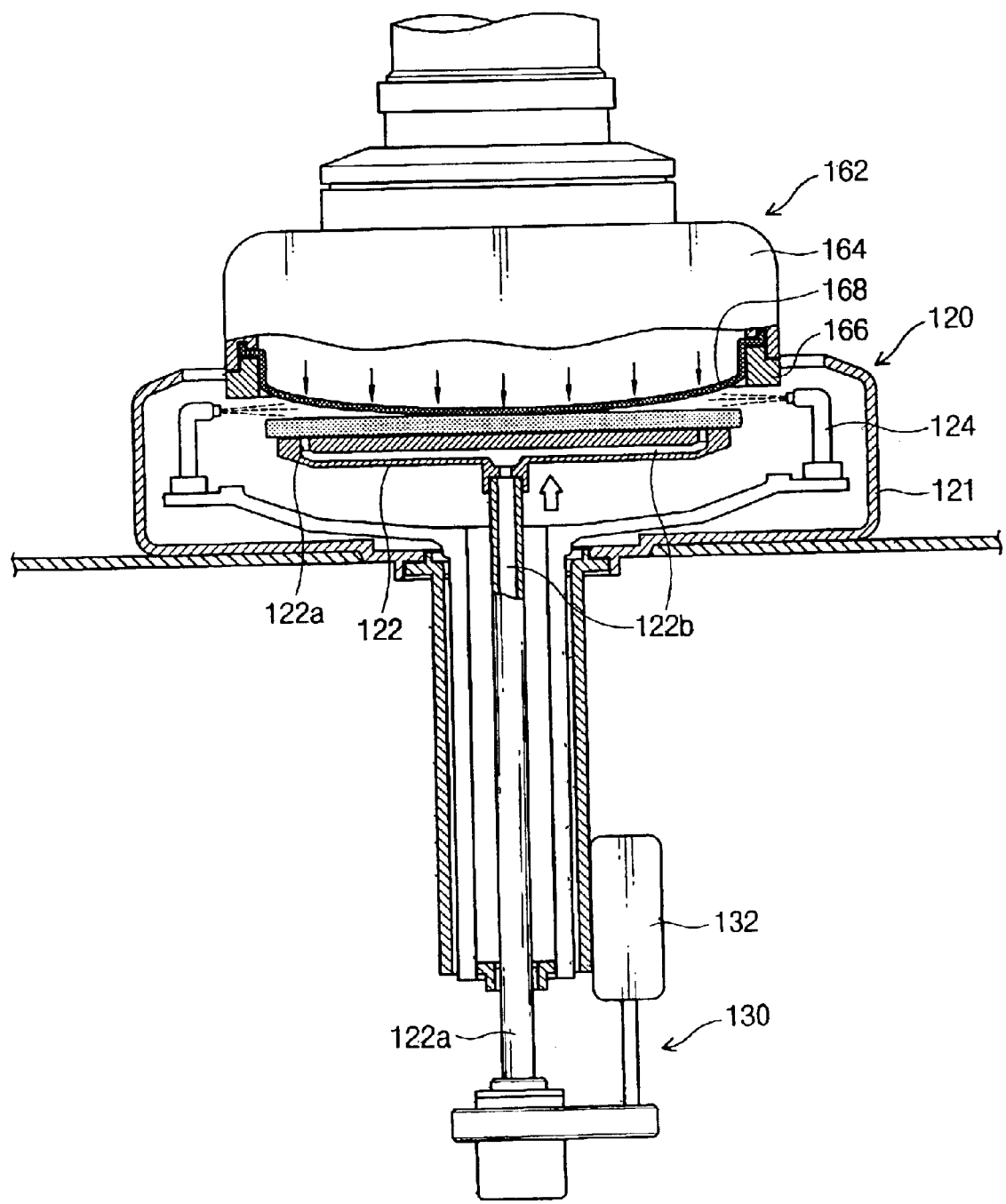
FIGS. 4 and 5 illustrate views of stages in a wafer unloading process according to an embodiment of the present invention.

Referring to FIG. 4, when the wafer W is unloaded from the polishing head 162 onto the pedestal 122, pure water is sprayed by the spray nozzle 124 toward a boundary region between the wafer W and the membrane 168 to reduce the surface tension between the wafer W and the membrane 168. This application of pure water provides a significant improvement in the unloading of the wafer.

In another embodiment of the present invention, the transfer stage 120 may also include a gas spray nozzle for spraying an inert gas, such as nitrogen, which does not cause physical and chemical changes on the wafer W.

Figure 6:
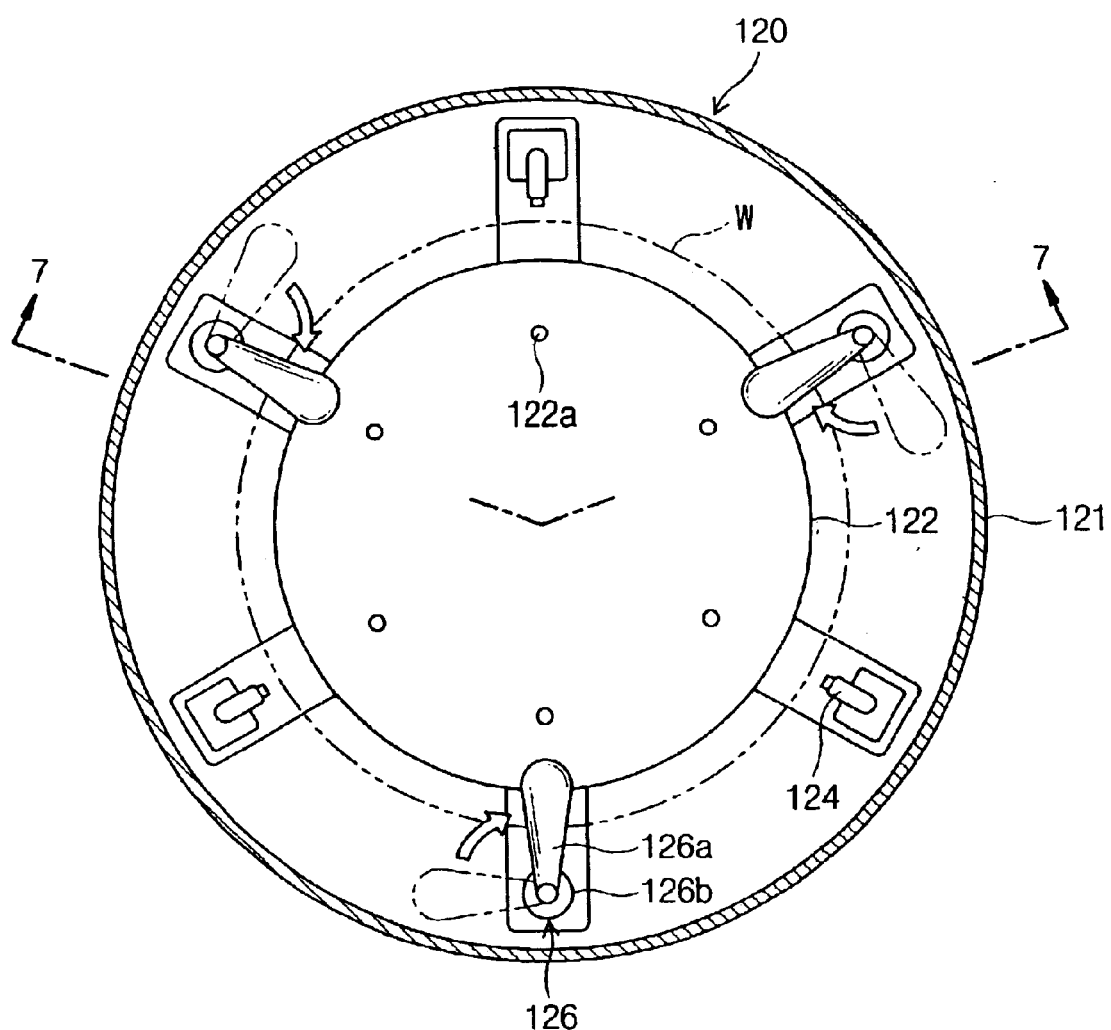
FIG. 6 illustrates a sectional view taken along line 6—6 of FIG. 3.
Figure 7:
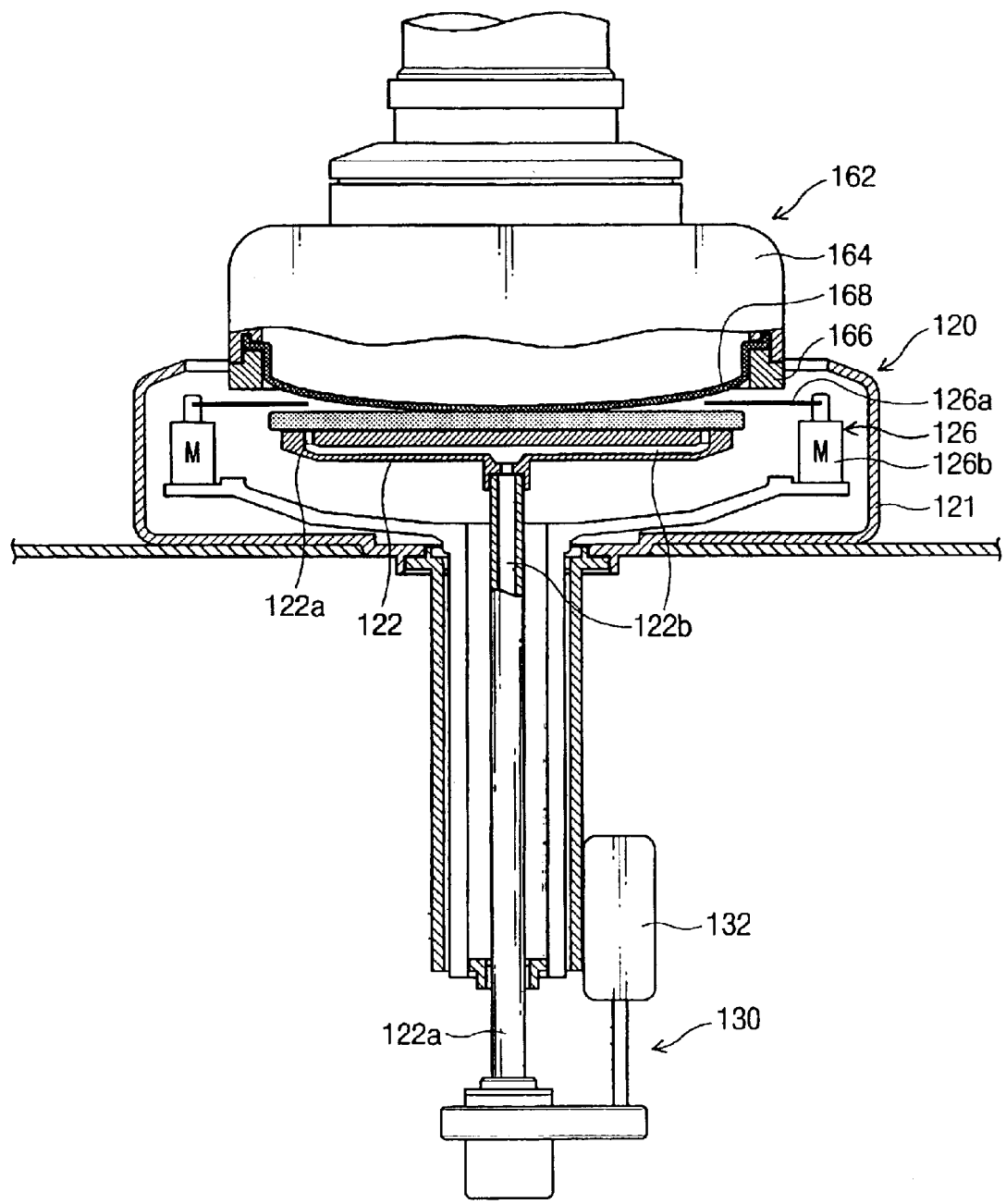
FIG. 7 illustrates a sectional view taken along line 7—7 of FIG. 6.

Referring to FIGS. 6 and 7, in an embodiment of the present invention, the transfer stage 120 may include a stopper to prevent the wafer W placed on the pedestal 122 from being lifted up along with membrane 168 and not remaining on the pedestal 122. The stopper 126 includes a blade 126a and a driving part 126b.

In operation, the blade 126a is inserted within the boundary region between the wafer W and the membrane 168 to prevent the wafer W from being lifted up along with the membrane 168. The driving part 126b drives the blade 126a to either move the blade 126a into or out of the boundary region between the wafer W and the membrane 168.

The blade 126a moves between a stand position and an interception position. The stand position is located beyond the boundary region between the wafer W and the membrane 168 and is shown as a dotted line in FIG. 6. The interception position is located within the boundary region between the wafer W and the membrane 168 and is shown as a solid line in FIG. 6. Preferably, the blade 126a has a length that is at least minimally sufficient to extend into the boundary region between the wafer W and the membrane 168 and to minimize a friction area when contacted with the wafer W.

Figure 5:
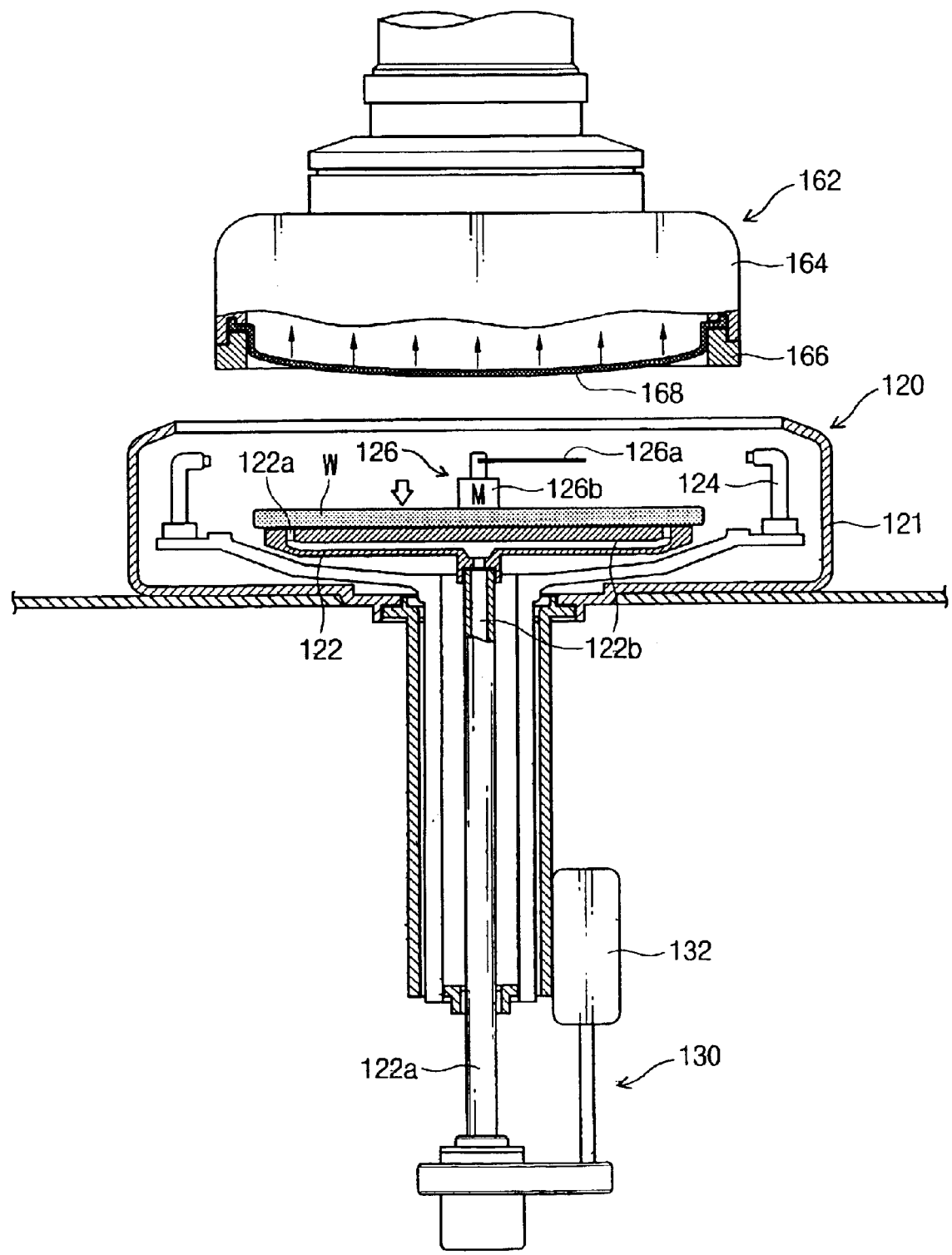

With reference back to FIGS. 4, 5 and 7, operation of a wafer unloading process in the transfer stage 120 having the above structure will now be described.

As shown in FIG. 4, when the polishing head 162 is moved to the transfer stage 120, the pedestal 122 of the transfer stage 120 ascends. Then, the membrane 168 is expanded by air pressure, and the wafer W is put on the pedestal 122. In this state, the pure water spray nozzle 124 sprays pure water into the boundary region between the wafer W and the membrane 168. The pedestal 122 adsorbs the wafer W using vacuum pressure. As shown in FIG. 7, the blade 126a of the stopper 126, which is located in the stand position, is moved into the boundary region between the wafer W and the membrane 168, i.e., the interception position, by the driving part 126b. Subsequently, as may be seen in FIG. 5, the expanded membrane 168 is contracted. Finally, the wafer W unloaded from the pedestal 122 and the wafer W is moved to a different apparatus, such as a cleaning apparatus, by a transfer robot (not shown).

In the present invention, a wafer unloading error may be prevented by various means, such as adsorbing the wafer W using vacuum pressure, by reducing the surface tension between the wafer W and the membrane 168 and increasing the weight of the wafer W, and by intercepting the wafer W to prevent the wafer W from being lifted up along with the membrane 168.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for polishing a wafer, comprising:
   a polishing station having a platen on which a polishing pad is installed;

a polishing head having a membrane that contacts a surface of the wafer, the membrane securing the wafer and pressuring the wafer against the polishing pad, wherein the polishing station includes a transfer stage for loading the wafer on or unloading the wafer from the polishing head, and wherein the transfer stage includes a pedestal on which the wafer is placed, a fluid supply part for supplying a fluid into a boundary region between the wafer and the membrane to reduce a surface tension between the wafer and the membrane, and a stopper for preventing the wafer placed on the pedestal from being lifted up alone with the membrane when the wafer is unloaded from the polishing head onto the pedestal.

2. The apparatus as claimed in claim 1, wherein the fluid supply part comprises a spray nozzle for spraying pure water into the boundary region between the wafer and the membrane.

3. The apparatus as claimed in claim 1, wherein the fluid supply part comprises a spray nozzle for spraying an inert gas into the boundary region between the wafer and the membrane.

4. The apparatus as claimed in claim 1, wherein the pedestal comprises a plurality of vacuum holes to adsorb the wafer using vacuum pressure when the wafer is unloaded from the polishing head onto the pedestal.

5. The apparatus as claimed in claim 4, wherein the stopper comprises:

a blade inserted into the boundary region between the wafer and the membrane to prevent the wafer from being lifted up along with the membrane; and a driving part for driving the blade to either move into or out of the boundary region between the wafer and the membrane.

6. The apparatus as claimed in claim 5, wherein the blade has a length at least minimally sufficient to extend into the boundary region between the wafer and the membrane and minimize a friction area when contacted with the wafer.

7. The apparatus as claimed in claim 1, wherein the stopper comprises:

a blade inserted into the boundary region between the wafer and the membrane to prevent the wafer from being lifted up along with the membrane; and a driving part for driving the blade to either move into or out of the boundary region between the wafer and the membrane.

8. The apparatus as claimed in claim 7, wherein the blade has a length at least minimally sufficient to extend into the boundary region between the wafer and the membrane and minimize a friction area when contacted with the wafer.

9. The apparatus as claimed in claim 1, wherein the pedestal comprises an elevating part for moving the pedestal vertically.

10. The apparatus as claimed in claim 1, wherein the transfer stage further comprises a catch cup surrounding the pedestal.

11. The apparatus as claimed in claim 1, wherein the polishing pad is a composite material having a rough polished face.

* * * * *